(12) United States Patent
Chou (10) Patent No.: US 6,963,085 B2
(45) Date of Patent: Nov. 8, 2005

(54) SOLID-STATE DISPLAY WITH IMPROVED COLOR-MIXING

(75) Inventor: Shen-Hong Chou, Kaohsiung (TW)

(73) Assignee: Au Optronics Corporation, Hsinchu (TW)

(*) Notice: Subject to any disclaimer, the term of this patent is extended or adjusted under 35 U.S.C. 154(b) by 87 days.

(21) Appl. No.: 10/715,927

(22) Filed: Nov. 18, 2003

(65) Prior Publication Data

US 2005/0104073 A1 May 19, 2005

(51) Int. Cl.[7] .................. H01L 33/00; H01L 21/00
(52) U.S. Cl. ................. 257/88; 257/89; 257/98; 438/29
(58) Field of Search ................ 257/88, 89, 98; 438/29, 30

(56) References Cited

U.S. PATENT DOCUMENTS 6,873,092 B2 * 3/2005 Tomoda et al. ............. 313/112

* cited by examiner

*Primary Examiner*—Mark V. Prenty
(74) *Attorney, Agent, or Firm*—Duane Morris LLP (57) ABSTRACT

A solid-state display device with an increased light mixing area is disclosed. The device comprises a substrate including a plurality of LEDs and reflecting surfaces alternately deposited thereon and a diffusing surface opposite the substrate including a transflective surface corresponding, and opposite, to selected ones of the LEDs, wherein light emitted from the LEDs is reflected from the corresponding transflective surface toward the reflecting surface and then back to the diffusing surface.

22 Claims, 7 Drawing Sheets

FIGURE 1
(PRIOR ART)

FIGURE 2 area - A = $\pi \cdot (H \cdot \tan\theta)^2$

FIGURE 3a area - A' = $\pi \cdot (3 \cdot r)^2$

FIGURE 3b area - A" = $\pi \cdot (3 \cdot H \cdot \tan\theta)^2$

SOLID-STATE DISPLAY WITH IMPROVED COLOR-MIXING

FIELD OF THE INVENTION

This application is related to the field of solid-state displays and more specifically to a structure for improving the color mixing of TFT-LCD backlight Light Emitter Diode (LED) displays.

BACKGROUND

The need for LCD displays, which typically are used in laptop and notebook computers, continues to increase. Not only have sales of notebook computers recently exceeded sales of desktop computer systems, but the LCD display is increasingly replacing the cathode ray tube (CRT) as the principal viewing means in desktop computer systems. The LCD display's light weight and low-power consumption are features that are essential to notebook computers and contribute to the LED display's popularity over CRTs in home and desktop computers.

In the majority of solid-state displays in use today, the light emitted by the discrete LEDs is mixed together in the viewing or diffuser plane. This requires the viewing or diffuser plane be sufficiently thick to allow for adequate color mixing. However, this thicker viewing surface, typically made of glass, contributes significant weight to the display itself and any device that it may be attached to. However, to reduce the viewing surface weight by reducing its thickness is not practical as the uniformity of the color mixing is affected by the reduced thickness.

Hence, a need for a display with a reduced thickness viewing surface that provides for good color mixing uniformity is desirable.

SUMMARY

A solid-state display device with increased light mixing area and a method for fabricating same is disclosed. The device comprises a substrate including a plurality of LEDs and reflecting surfaces alternately deposited thereon and a diffusing surface opposite the substrate including a transflective surface corresponding, and opposite, to selected ones of the LEDs, wherein light emitted from the LEDs is reflected from the corresponding transflective surface toward the reflecting surface. The angle of the light reflected from the reflecting surface back toward the diffusing surface is greater than the light initiated emitted by the corresponding LED.

It is to be understood that these drawings are solely for purposes of illustrating the concepts of the invention and are not intended as a definition of the limits of the invention. The embodiments shown in FIGS. 2 and 3–7 and described in the accompanying detailed description are to be used as illustrative embodiments and should not be construed as the only manner of practicing the invention. Also, the same reference numerals, possibly supplemented with reference characters where appropriate, have been used to identify similar elements.

DETAILED DESCRIPTION OF THE INVENTION

Figure 1:
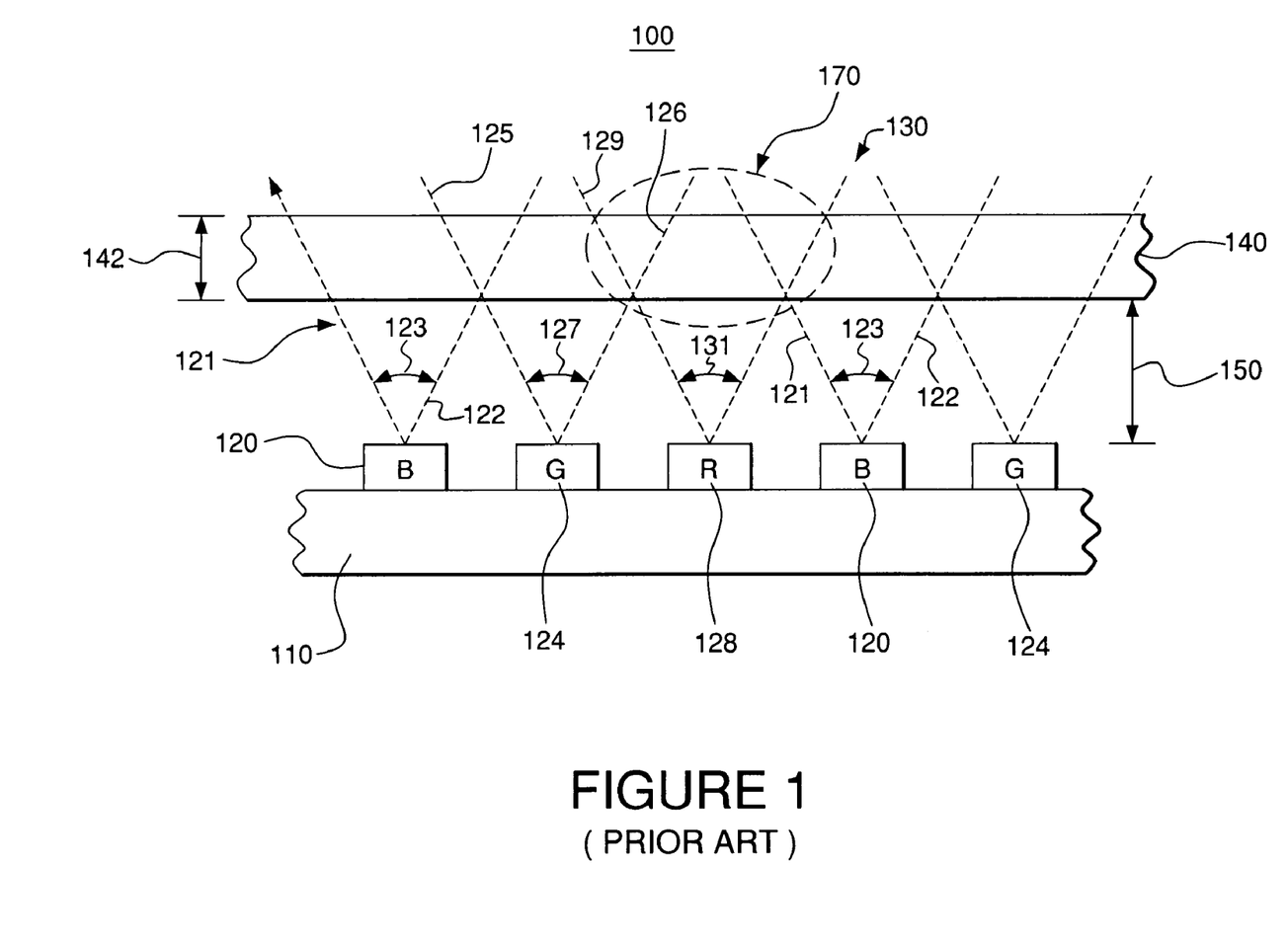
FIG. 1 illustrates a conventional solid state LED display.

FIG. 1 illustrates a conventional TFT-LCD backlight LED display 100 comprising a substrate 110 upon which are uniformly deposited a plurality of LEDs. In this conventional display, the LEDs referred to as 120, 124 and 128 are representative of LEDs that emit colors that substantially correspond to blue, green and red colors or wavelengths, respectively. Although LEDs 120, 124 and 128 may represent LEDs of other colors, the red, green and blue shown herein are standard in the solid-state display industry, i.e., RGB displays.

Opposite to substrate 110 is viewing surface or diffuser plane 140 having a known thickness 142. Diffusing surface 140 is an optical diffusing surface that enables the emitted light from the individual LEDs to be mixed. Diffuser surface or plane 140 may be selected from a group of materials such as Silicon Dioxide ($SiO_2$) or Titanium Oxide ($TiO_2$). One skilled in the art would recognize that diffusing surface 140 is maintained a known distance, represented as 150, above the surface of LEDs 120, 124, 128. Furthermore, the edges around diffusing surface 140 and substrate 110 are sealed and the space therebetween evacuated. Spacers (not shown) may be used to maintain distance 150.

In operation, light energy, represented by photon emission lines 127 and 128, emanate from, for example, green LED 124 and strike viewing surface 140 in a known region, which is determined by distance 150 and an angle represented by arc 127. Similarly, light energy represented by photon lines 129 and 130 emanate from, for example, red LED 128 and strike viewing surface 140 in a region determined by distance 150 and an angle represented by arc 131. Similarly, light energy represented by photon lines 121 and 122 emanate from, for example, blue LED 120 and strikes viewing surface 140 in a region determined by distance 150 and an angle represented by arc 123. The light energy or photons from each of the discrete LEDs is mixed in viewing surface 140, in this illustrative example, in the region denoted as 170, to produce a desired light or color effect. In a conventional display, viewing surface 140 is typically 2 millimeters thick to allow for adequate color mixing. Although photons are shown emanating from the center of each LED, one skilled in the art would recognize that is merely to illustrate the sustained angle and that photons would emanate across the LED active region (not shown).

Figure 2:
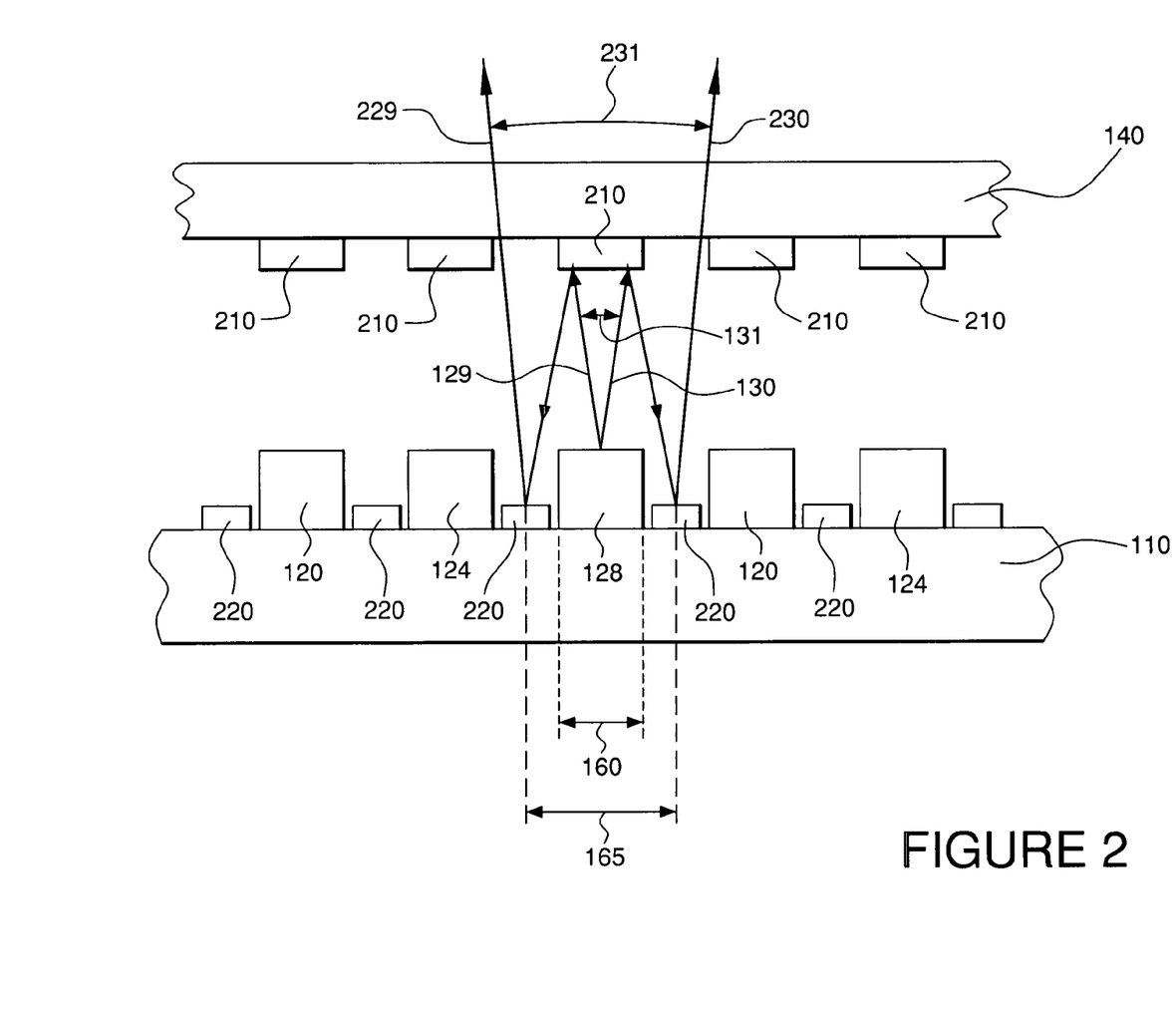
FIG. 2 illustrates a first exemplary embodiment of a TFT-LCD LED display in accordance with the principles of the invention.

FIG. 2 illustrates a first exemplary embodiment of an LED display 200 in accordance with the principles of the present invention. In this embodiment, display 200 comprises a substrate 110 upon which are deposited LEDs 120, 124 and 128 as previously discussed. Further deposited on substrate 110, between LEDs 120, 124 and 128, are reflective surfaces 220 that are operable to reflect photons impinging thereon. Opposite to substrate 110 is viewing surface or diffuser plane 140 as previously discussed. Deposited on viewing surface 140, and substantially opposite a corresponding LED, is transflective surface 210. Transflective surface 220 is made from materials that are known in the art to possess a property that allows for a range of light transmittance and reflectivity between 10 percent and 90 percent.

In operation, photons, represented as photon path lines 129 and 130, emanating from LED 128 are directed toward transflective surface 210, which reflects an known percentage of the light photons, represented as photon path lines 229 and 230, back towards reflective surfaces 220 adjacent to the LED emitting the photons. The reflected photons are then reflected from reflective surface 220 and pass through viewing surface 140. The use of transflective surface 210 and reflective surface 220 is advantageous as they effectively increase the width of the photon emission of a corresponding LED from width 160 to width 165. Display 200, accordingly, provides for a larger color mixing area in diffuser surface 140. The degree of reflection of the photons by transflective surface 210 and reflective surface 220 may be determined using the well known Snell Law of Reflection.

Figure 3A:
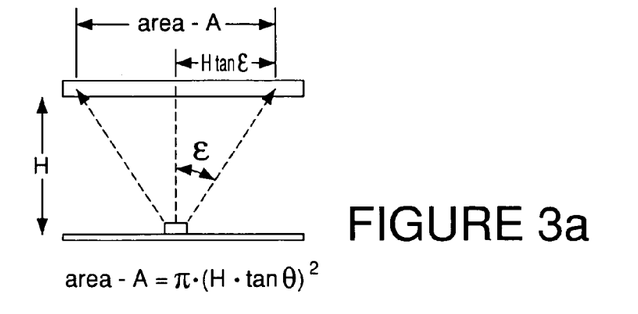
FIGS. 3a–3c illustrate methods for determining color mixing area in solid-state LED display.

FIG. 3a illustrates a method for determining the color mixing area (A) of a conventional display, wherein "d" 150 is the height between the diffusing surface 140 and LED 128, for example, and θ, is one-half the light emitting angle 131 of LED 128 of a conventional display. Using well known methods, the color mixing area-A may be determined as:

$$A = \pi \cdot (d \cdot \tan \theta)^2. \quad [1]$$

Figure 3B:
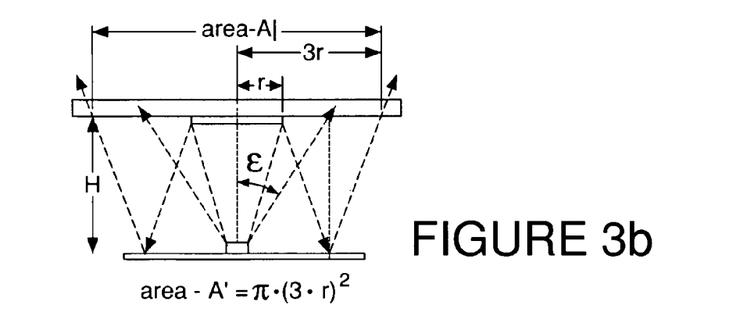

FIG. 3b illustrates a method for determining the color mixing area (A') in one exemplary embodiment of the invention, where area (A') is the emitting area on viewing surface 140, "d" 150 is the height between viewing surface 140 and LED 128, for example, θ is one-half the photon emitting angle 131 of LED 128, and "r" is a length or radius of transflective surface 210. As one skilled in the art would recognize, transflective surface 210 may be deposited on diffusing surface 140 in the shape of a square, rectangular, circle, ellipse, etc. In this exemplary embodiment, wherein transflective surface 210 is circular having radius "r". In this case, the radius is shown as being less than distance 150. The color mixing area-A' may be determined as:

$$A' = \pi \cdot (3 \cdot r)^2. \quad [2]$$

Figure 3C:
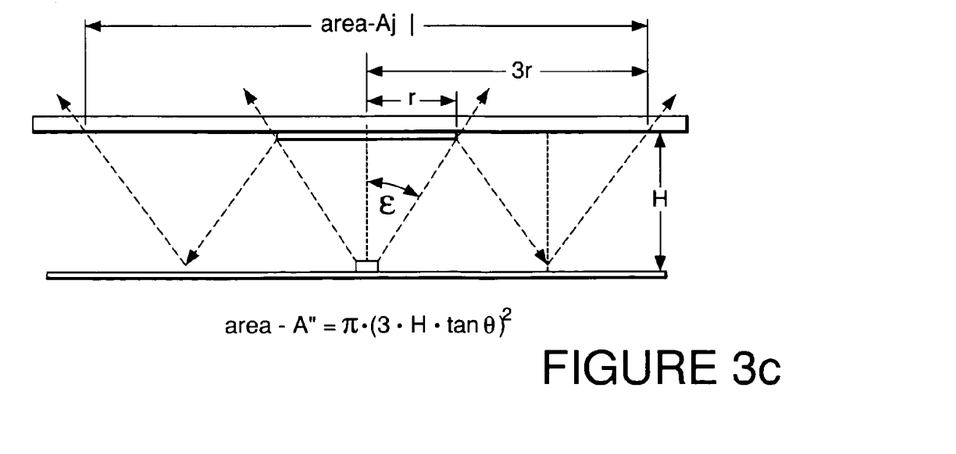

FIG. 3c illustrates a specific case for determining the color mixing area wherein length or radius r is equal to the product of d and tan θ. In this case, color-mixing area (A") may be determined as:

$$A'' = \pi \cdot (3 \cdot d \cdot \tan \theta)^2. \quad [3]$$

The present invention has been explained with respect to LED 128 to avoid unnecessary clutter from intersecting photon path lines from adjacent LEDs 120 and 124. However, it would be recognized by those skilled in the art that similar reflections would occur for photons emitted from adjacent green LED 124 and blue LED 120.

Figure 4:
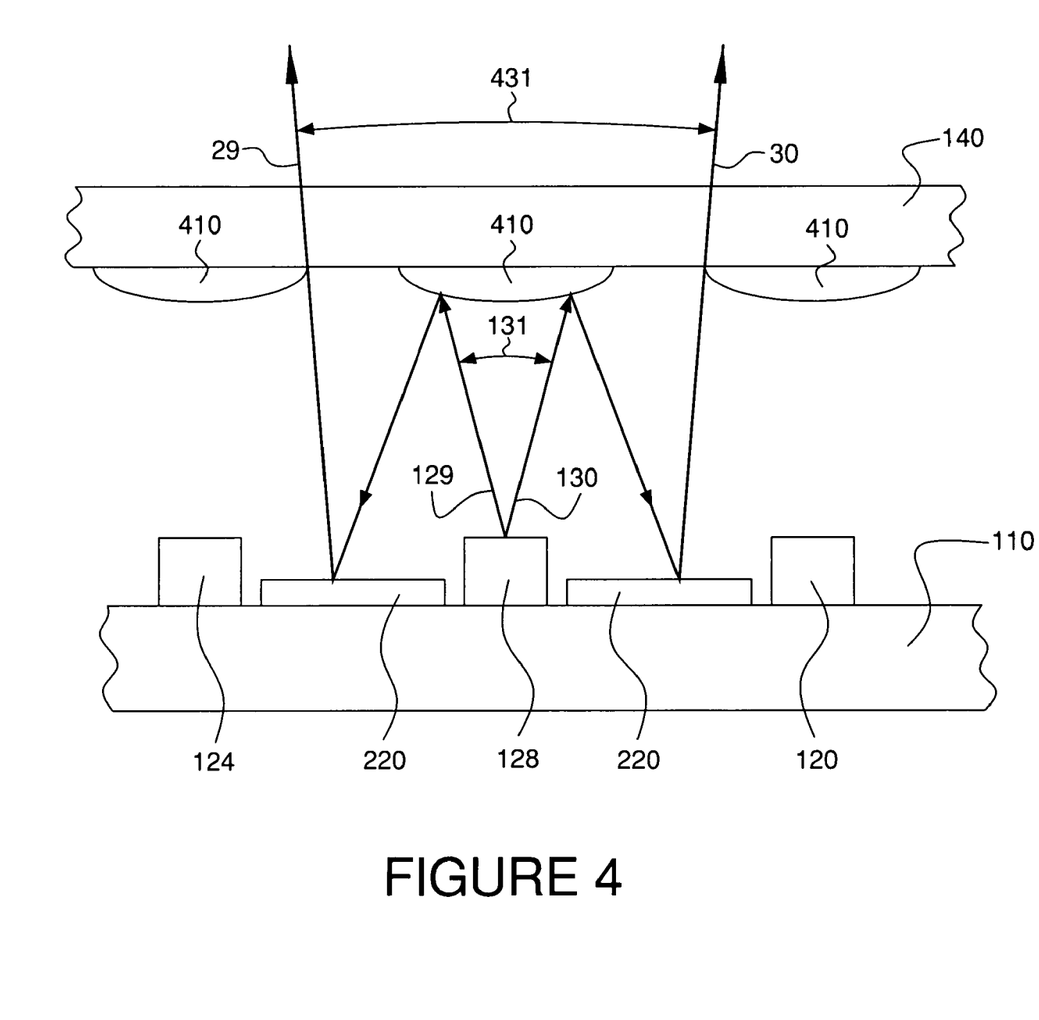
FIG. 4 illustrates a second exemplary embodiment of a TFT-LCD LED display in accordance with the principles of the invention.

FIG. 4 illustrates a second exemplary embodiment of the present invention, wherein transflective surface 410 is spherically or semi-spherically shaped. In this case, the angle 431 sustained between photon path lines 429 and 430 is increased significantly over angle 131, and, consequently, the color mixing area may be determined by equation 2 or 3.

Figure 5:
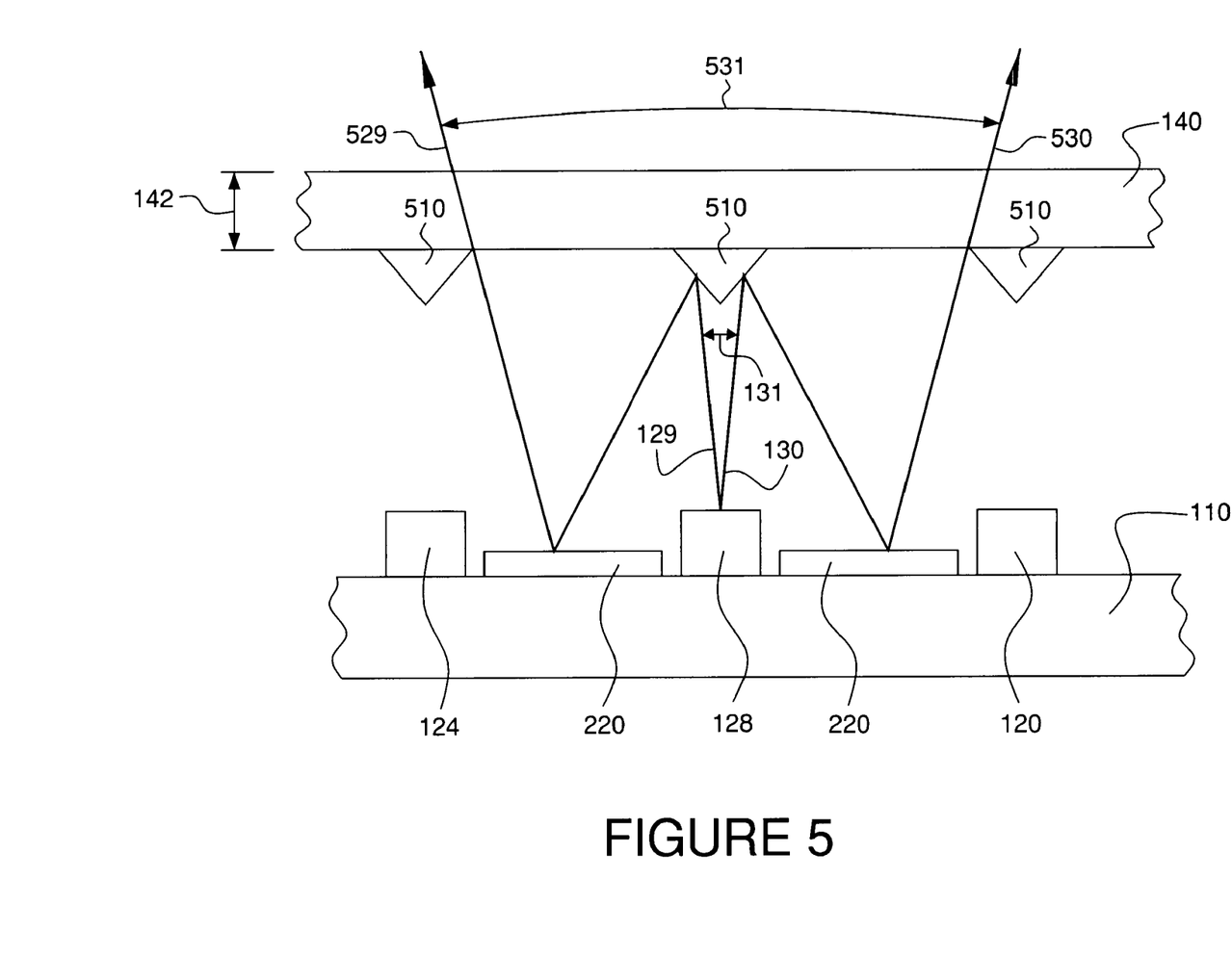
FIG. 5 illustrates a third exemplary embodiment of a TFT-LCD LED display in accordance with the principles of the invention.

FIG. 5 illustrates a third exemplary embodiment of the present invention, wherein transflective surface 510 is conical or triangular shaped. In this case, the angle 531 sustained between photon path lines 529 and 530 is again increased significantly over angle 131.

It will be recognized by those skilled in the art that by altering the shape of the transflective surfaces on diffusing surface 140, the reflection pattern may be altered and consequently the color mixing area in surface 140 may be adjusted. The cross-sectional shape of the transflective surface may, for example, be square, rectangular, triangular, spherical, or oblong.

Figure 6:
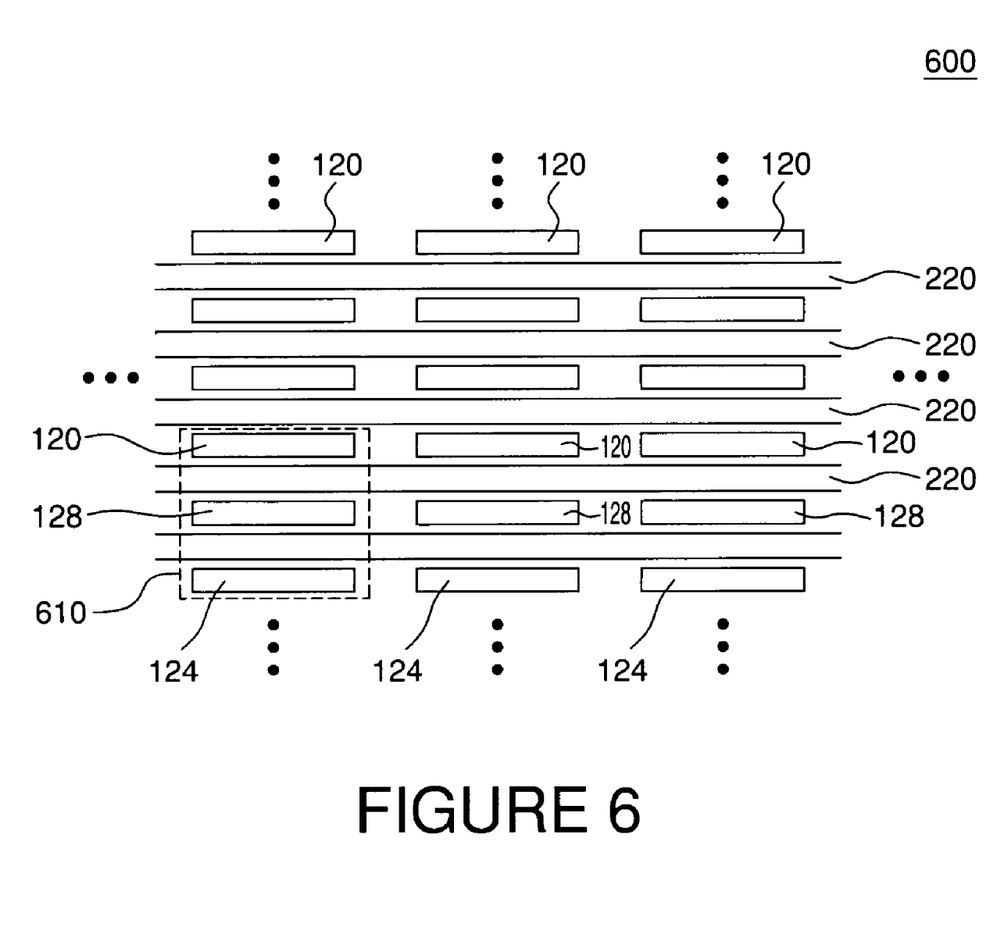
FIG. 6 illustrates a top view of a first embodiment of a LED display structure in accordance with the principles of the invention.

FIG. 6 illustrates a top view of an embodiment of LED structure 600 in accordance with the principles of the invention. In this case, reflective surface 220 is positioned parallel or lateral to each LED to allow for the further reflection of photons reflected from transflective surface 210, for example. In the aspect of the invention shown, reflective surface 220 is associated with each of the colored LEDs. Although reflective surface 220 is shown distributed adjacent to LED rows, it would be recognized by those skilled in the art that reflective surface 220 may also be oriented so that it is distributed adjacent to LED columns.

Figure 7:
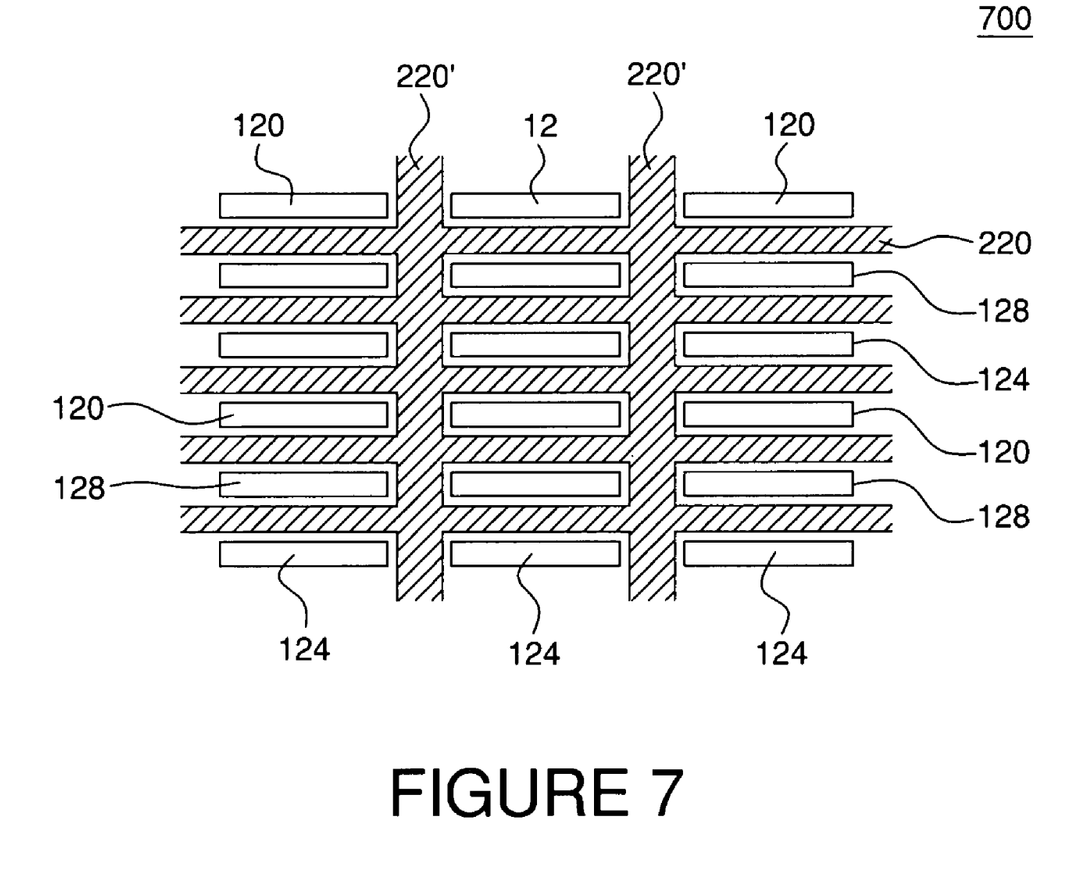
FIG. 7 illustrates a top view of a second embodiment of a LED display structure in accordance with the principles of the invention.

FIG. 7 illustrates a top view of an embodiment of LED structure 700 in accordance with the principles of the invention. In this illustrated embodiment, reflective surface 220 is distributed laterally along LED rows, i.e., parallel, and distributed laterally along LED columns, i.e., perpendicular, represented as 220'. The organization of reflective surface 220 in this manner provides greater reflective surface area to reflect photons to the diffusing surface 140.

While there has been shown, described, and pointed out fundamental novel features of the present invention as applied to preferred embodiments thereof, it will be understood that various omissions and substitutions and changes in the apparatus described, in the form and details of the devices disclosed, and in their operation, may be made by those skilled in the art without departing from the spirit of the present invention. It is expressly intended that all combinations of those elements that perform substantially the same function in substantially the same way to achieve the same results are within the scope of the invention. Substitutions of elements from one described embodiment to another are also fully intended and contemplated.

I claim:

1. A solid-state display comprising:
   a substrate including a plurality of LEDs and reflecting surfaces alternately deposited thereon; and
   a diffusing surface opposite said substrate including a transflective surface corresponding and opposite to each of said LEDs, wherein light emitted from said LEDs is reflected from said corresponding transflective surface, toward said reflecting surface.

2. The display as recited in claim 1, wherein said transflective surface has a known cross-sectional shape.

3. The display as recited in claim 2, wherein said cross-sectional shape is selected from the group consisting of square, rectangular, conic, triangular, semi-spherical, spherical, oblong.

4. The display as recited in claim 1, wherein said substrate and diffusing surface are sealed and a space therebetween evacuated.

5. The display as recited in claim 1, wherein said substrate reflective surface is selected from the group consisting of: aluminum, gold, tin, copper.

6. The display as recited in claim 1, wherein said diffusing surface is selected from the group consisting of: SiO2, TiO2.

7. The display as recited in claim 1, wherein said transflective surface has a known reflectivity and transmission characteristic.

8. The display as recited in claim 7, wherein said reflectivity of said transflective surface is in the range of 10 to 90 percent.

9. The display as recited in claim 1, wherein said reflective surface is positioned lateral to a corresponding LED.

10. The display as recited in claim 9, wherein said reflective surface is further positioned perpendicular to said lateral reflective surface.

11. The display as recited in claim 1, wherein said transflective surface has a shape selected from the group consisting of square, rectangular, circular, triangular.

12. A method for increasing the color-mixing area of a LED display comprising the steps of:
   depositing a reflective layer between at least adjacent rows or columns of LEDs positioned on a substrate; and
   depositing a transflective surface on a diffusing surface opposite and proximate to corresponding selected ones of said LEDs, wherein said transflective surface is operable to reflect light emitted from said LEDS to said reflective surface.

13. The method as recited in claim 12, wherein said transflective surface has a known cross-sectional shape.

14. The method as recited in claim 13, wherein said cross-sectional shape is selected from the group consisting of: square, rectangular, conic, triangular, semi-spherical, spherical, oblong.

15. The method as recited in claim 12, wherein said substrate and diffusing surface are sealed and a space therebetween evacuated.

16. The method as recited in claim 12, wherein said substrate reflective surface is selected from the group consisting of: aluminum, gold, tin, copper.

17. The method as recited in claim 12, wherein said diffusing surface is selected from the group consisting of: SiO2, TiO2.

18. The method as recited in claim 12, wherein said transflective surface has a known reflectivity and transmission characteristic.

19. The method as recited in claim 18, wherein said reflectivity of said transflective surface is in the range of 10 to 90 percent.

20. The method as recited in claim 12, wherein said reflective surface is deposited lateral to a corresponding LED.

21. The method as recited in claim 20, wherein said reflective surface is further deposited perpendicular to said lateral reflective surface.

22. The method as recited in claim 12, wherein said transflective surface has a shape selected from the group consisting of: square, rectangular, circular, triangular.

* * * * *